United States Patent
Tilley et al.

[11] Patent Number: 6,114,980
[45] Date of Patent: Sep. 5, 2000

[54] METHOD AND APPARATUS FOR SETTLING A DC OFFSET

[75] Inventors: Keith A. Tilley, Sunrise; Raul Salvi; Enrique Ferrer, both of Miami, all of Fla.

[73] Assignee: Motorola, Inc., Schaumburg, Ill.

[21] Appl. No.: 09/290,564

[22] Filed: Apr. 13, 1999

[51] Int. Cl.[7] ........................................... H03M 1/10
[52] U.S. Cl. ........................ 341/118; 327/307; 330/9
[58] Field of Search .................. 341/118; 327/307; 330/2, 9, 83, 135; 332/107, 123, 125, 159, 162; 455/63, 67.1, 355

[56] References Cited

U.S. PATENT DOCUMENTS

| | | | |
|---|---|---|---|
| 4,495,470 | 1/1985 | Bristol | 330/9 |
| 5,087,914 | 2/1992 | Sooch et al. | 341/118 |
| 5,153,592 | 10/1992 | Fairchild et al. | 341/118 |
| 5,397,944 | 3/1995 | Dupuis | 327/307 |
| 5,617,473 | 4/1997 | Wietecha et al. | 379/399 |
| 5,789,974 | 8/1998 | Ferguson, Jr. et al. | 330/2 |
| 5,877,645 | 3/1999 | Comino et al. | 327/350 |
| 5,912,926 | 6/1999 | Koench et al. | 332/123 |

*Primary Examiner*—Howard L. Williams
*Attorney, Agent, or Firm*—Barbara R. Doutre

[57] ABSTRACT

A DC offset correction loop (200) utilizes a sign bit generator (204), binary search stage (206), and a digital-to-analog converter (208) in its feedback path to correct for DC offsets at the input of a gain stage (202).

36 Claims, 4 Drawing Sheets

METHOD AND APPARATUS FOR SETTLING A DC OFFSET

TECHNICAL FIELD

This invention relates to techniques and apparatus for minimizing DC offsets in electronic circuits.

BACKGROUND

FIG. 1 is a block diagram of a traditional analog DC offset correction loop 100 such as would be used around the baseband path of a direct conversion receiver or zero IF receiver of a radio, cell phone, or other communication device. Correction loop 100 is used for single ended applications and generally includes a baseband filter 102, an integrator 104, an operational transconductance amplifier (OTA) 106, and mixer 108 whose output impedance and DC bias current are represented by a current source 110 and a resistor 112. The desired DC voltage at the output of the baseband filter 102 is analog ground, Vag, however, the interaction of the current source 110, resistor 112, and the input referred DC offset of the baseband filter 102 generates an undesired DC offset at the filter input. The DC offset at the input of the baseband filter 102 is amplified through the baseband filter and produces a large offset at the baseband filter output. The integrator 104 and OTA 106 provide a feedback path to alter the current through the resistor 112 to adjust the voltage presented to the input of the baseband filter 102 thereby reducing the input referred DC offset.

Modern communications systems often require fast settling times. Even small DC offsets can saturate the baseband filter causing all linear loop equations to be invalid making it very difficult to settle the loop within the allotted time. Once the offset has been corrected, the correction loop must be moved to a much lower corner frequency or opened completely. Making a transition from a very wide offset correction loop bandwidth to a very narrow bandwidth poses a problem due to the transient response produced when making such a large transition. Opening the loop in an analog DC offset loop causes the correction voltage to drift from the desired value due to leakage on the integrator's 104 capacitor.

Accordingly, there is a need for an improved method and apparatus for correcting DC offsets, particularly those offsets which occur in zero IF and direct conversion receivers.

DETAILED DESCRIPTION OF THE PREFERRED EMBODIMENT

Figure 1:
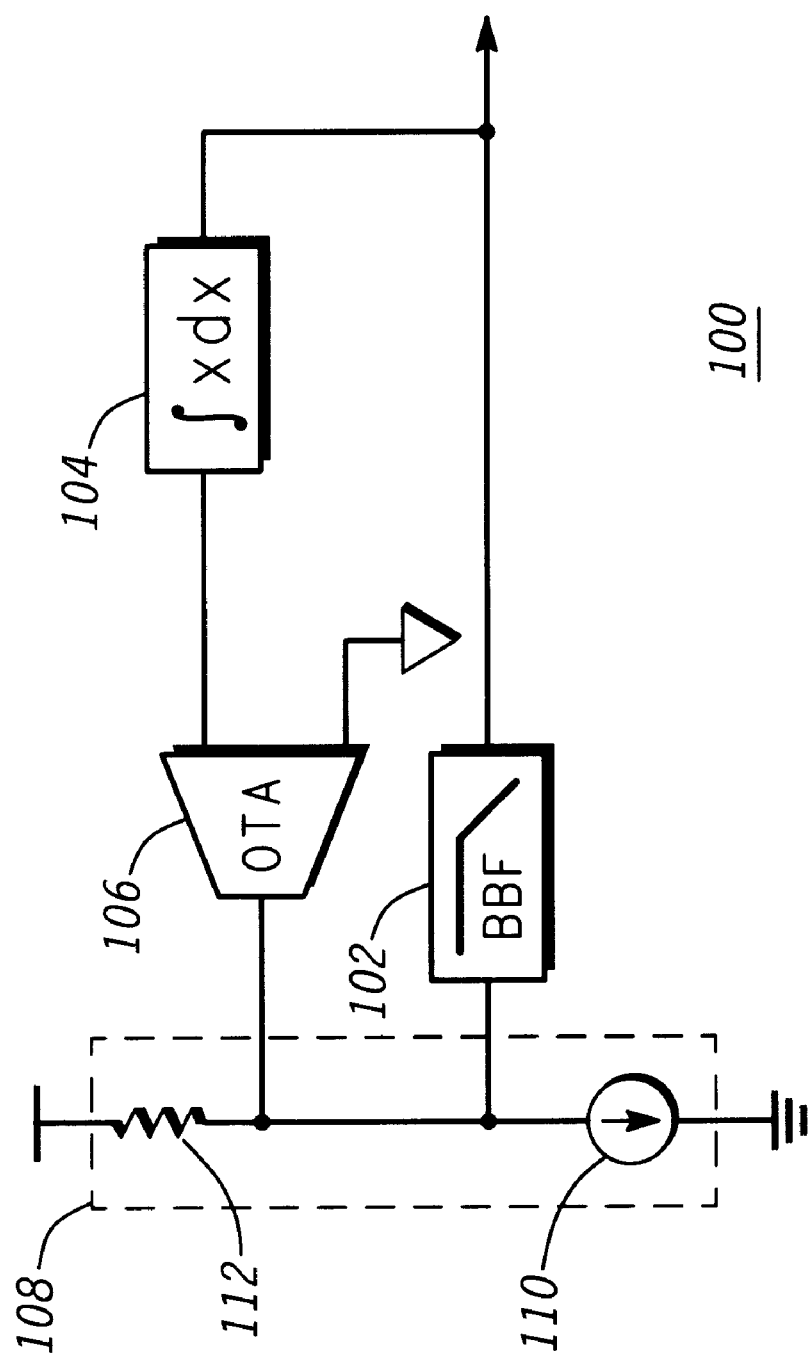
FIG. 1 is a block diagram of a prior art DC offset correction loop.

While the specification concludes with claims defining the features of the invention that are regarded as novel, it is believed that the invention will be better understood from a consideration of the following description in conjunction with the drawing figures.

Briefly, the DC offset correction loop of the present invention incorporates a sign bit controlled binary search stage in combination with a digital-to-analog converter to correct for DC offsets in electronic circuits.

Figure 2:
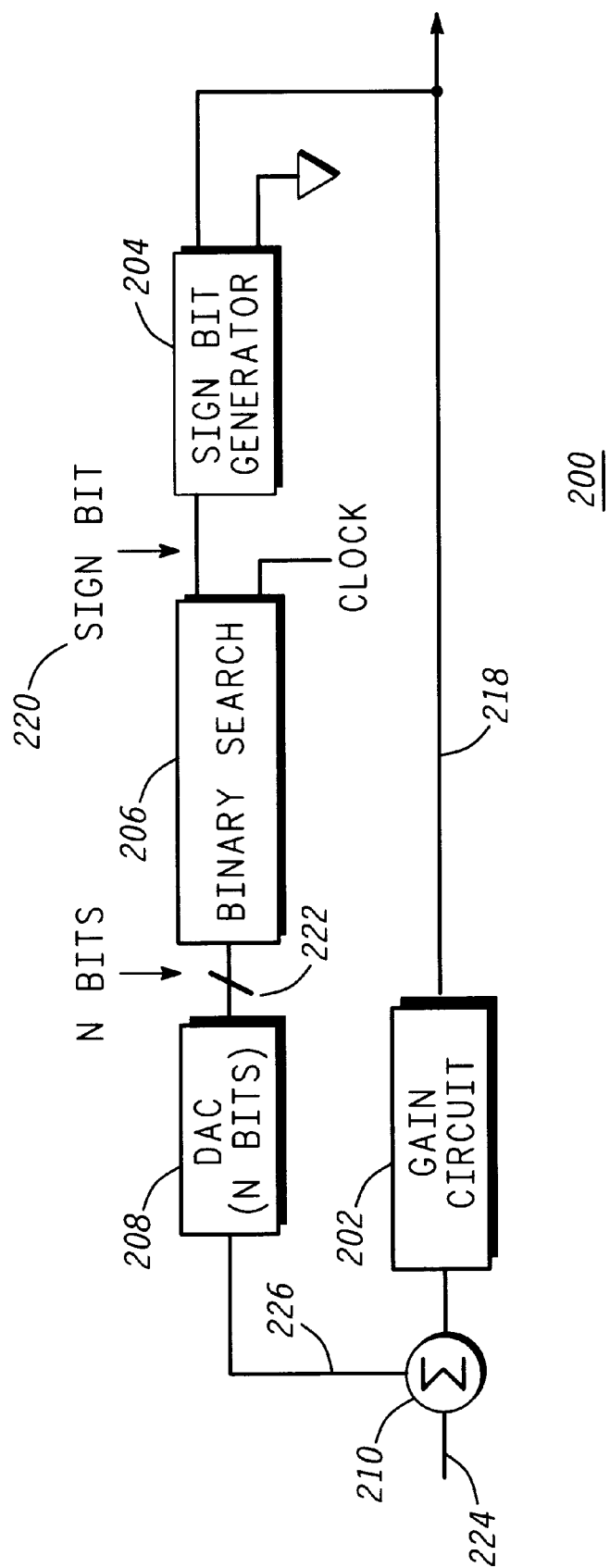
FIG. 2 is a block diagram of a DC offset correction loop in accordance with the present invention.

FIG. 2 is a block diagram of a DC offset correction loop 200 in accordance with the present invention. Offset correction loop 200 includes a gain stage 202, a sign bit generator 204, a binary search stage 206, a digital-to-analog converter (DAC) 208, and a summer 210. The gain stage 202 may be implemented using a variety of gain devices, such as a baseband filter or an amplifier. The sign bit generator 204 may be implemented through a variety of devices, such as a comparator, a limiter, an analog-to digital converter (ADC), or similar device. In accordance with the invention, the sign bit controlled binary search means 206 is incorporated into the feedback path to provide improved DC offset correction. The binary search stage 206 provides a binary search means which may be implemented in software, using known binary search algorithms, or hardware, using adders and registers.

In operation, with no input signal present other than a DC offset at the input 224 to summer 210, there will be a DC offset at the input of the gain stage 202 for which a correction is desired. The gain stage 202 amplifies this DC offset and produces an amplified DC offset 218. The amplified DC offset 218 is fed back to the sign bit generator 204 where it gets converted to a positive or negative sign bit 220. In accordance with the present invention, the sign bit 220 is used as an input to the binary search stage 206 to determine which direction to move the offset correction. The binary search stage 206 takes the sign bit 220 and a clock input and produces a bit string 222 to step the DAC 208. Each time the DAC 208 is stepped, a new correction voltage 226 is generated which is fed back to the summer 210 and used to correct the DC offset present at the input to the gain stage 202.

In accordance with the present invention, the only information being fed back to the binary search stage 206 is the direction with which to correct the offset. The binary search stage 206 uses the sign bit 220 to step the DAC 208 through a binary search of DAC settings, taking one step for each adjusted DC offset, until the DAC has been stepped to its least significant bit thereby providing a final correction voltage. Thus, the offset correction loop 200 is able to determine an appropriate DAC setting in the minimum amount of time.

For a binary algorithm, operation preferably begins at a predetermined DAC setting of $2^N/2$, where N represents the number of bits. The direction of each DAC step is based on the sign bit 220. The initial step of the DAC will be $2^N/2^2$. The steps will then become incrementally smaller each time according to the pattern $2^N/2^2, 2^N/2^3, 2^N/2^4 \ldots 2^N/2^N$. When the DAC steps $2^N/2^N$, the least significant bit (LSB) will have been adjusted, and the search is complete. For some applications, other start points may be desired. The binary search stage 206 steps the DAC 208 up or down using incrementally smaller steps until the LSB is achieved. For each transition coming through the DAC 208 the bit settings change and this change in bit settings changes the output of the DAC 208. The changes in the output of the DAC 208 are presented to the summer 210 to offset the input to the gain stage 202. The DC offset is adjusted through each step, which in turn adjusts the sign bit as necessary. Once the final step has been reached, the DAC setting is held constant until another correction sequence is initiated.

The following method can be used to describe the DC offset correction technique in accordance with the present invention. The technique is initialized by setting the DAC 208 to a predetermined setting. Next, the DC offset present at the gain stage input is amplified and produces an amplified DC offset. Then, in accordance with the present invention, the steps of generating a sign bit based on the amplified DC offset, stepping the DAC by a predetermined amount in a direction indicated by the sign bit, and generating an analog voltage in response to the stepped DAC, are executed. The final step includes correcting the DC offset at the input of the gain stage in response to the analog voltage, and repeating the steps of amplifying through correcting until the least significant bit (LSB) of the DAC has been adjusted. Further steps include maintaining the DAC setting until a new programming event occurs, and re-initiating the search in response to the new programming event.

For this search technique, N−1 clock cycles are used, where N is the number of DAC bits. Upon completion of the search, the DAC setting is preferably held until the entire procedure is re-initiated by a programming event. The clock rate of the correction loop 200 is preferably selected such that the output of the gain stage 202 settles before another change in the DAC 208 is attempted.

Figure 3:
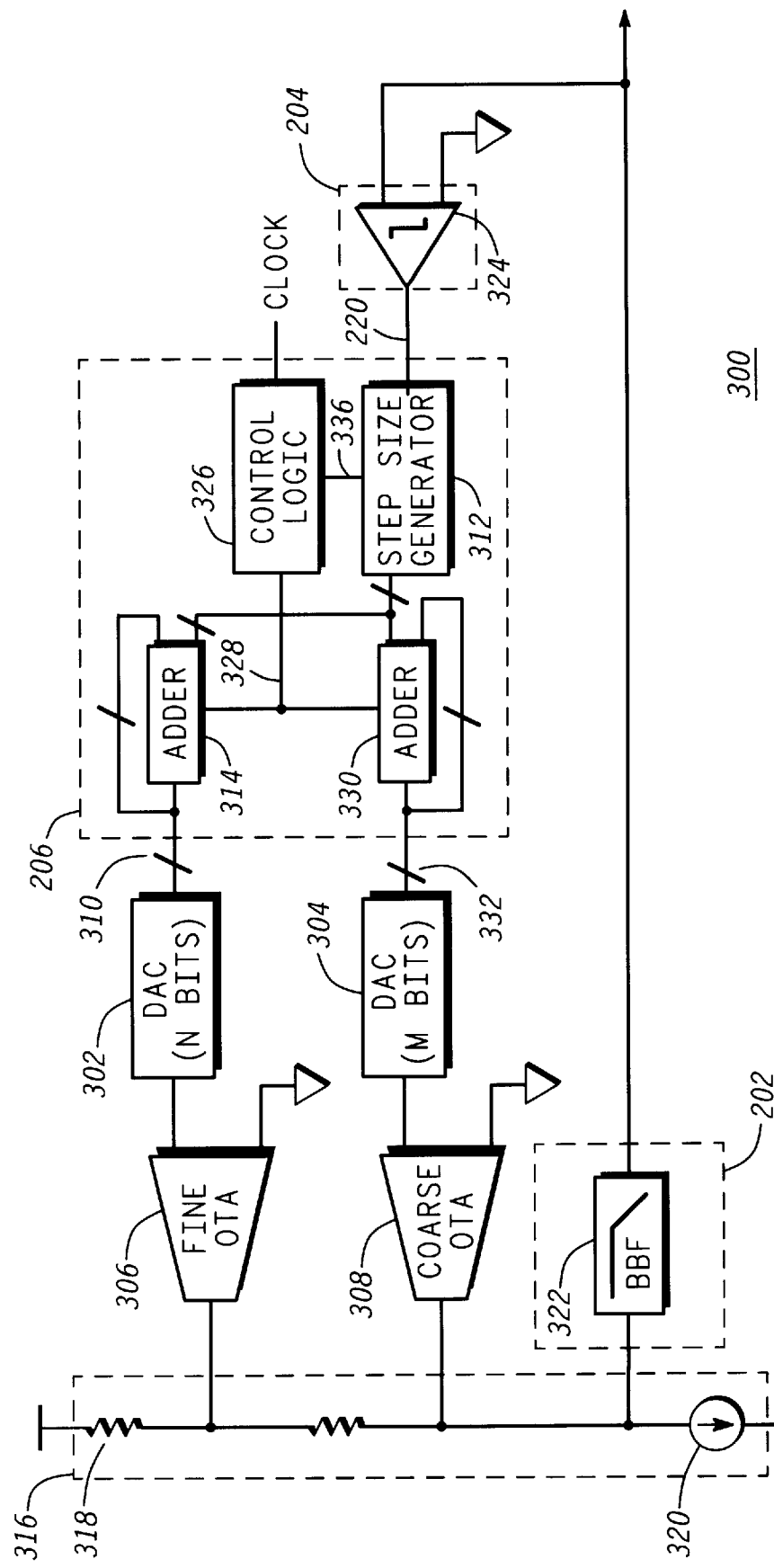
FIG. 3 is a block diagram showing the DC offset correction loop of the present invention including coarse and fine tuning adjusters.

Increased precision may be obtained through the use of additional DACs and OTAs. FIG. 3 shows a simplified block diagram of a DC offset correction loop 300 formed in accordance with the present invention and implemented in a system having both coarse and fine tuning. Like numerals have been carried forward where applicable. DC offset correction loop 300 includes the gain stage 202 being implemented as a baseband filter 322, and the sign bit generator 204 being implemented as a comparator 324. The binary search stage 206 is shown implemented using control logic 326 which controls, via control lines 328, 336 a step size generator 312 and two adders 314, 330. The two adders 314, 330 generate separate bit strings 310, 332. The offset correction loop 300 further includes two DACs 302, 304 and two operational transconductance amplifiers 306, 308. DAC 302 and OTA 306 provide fine tuning adjustment while DAC 304 and OTA 308 provide coarse tuning adjustment to the offset correction loop 300. The outputs of the OTAs 306, 308 are coupled to a receiver device 316 whose output impedance and DC bias current are represented by resistors 318 and current source 320.

In accordance with the present invention binary search stage 206 generates the first bit string 332 for coarse tuning the loop 300 while the fine tuning correction value at the output of the second OTA 306 is held without correction (at zero). The coarse adjustment begins at the predetermined setting of the first DAC 304, preferably $2^N/2$. The coarse adjustment of loop 300 is performed by stepping the first DAC 304 through a predetermined number of successively smaller steps with the sign of each step being controlled by the sign bit 220. Once the coarse tuning is completed, the coarse correction value is held constant at the output of the first OTA 308 while another binary search is performed using the second DAC 302 and second OTA 306 for fine adjustment via bit string 310.

For example, if first DAC 304 coarse tunes using 6 bits and the second DAC 302 fine tunes using 7 bits, for a total of 13 bits of resolution, then the DC correction loop corrects in:

(6−1)+(7−1)=11 clock cycles.

As another binary search alternative, the binary search stage 206 can tune the first DAC 304 by incrementally stepping the first DAC in the direction indicated by the sign bit until the DC offset has been overcorrected (i.e. until the sign bit changes). The first DAC 304 is then decremented by one step in response to the loop 300 being overcorrected. The loop 300 is then fine tuned by incrementally stepping the second DAC 302 in the direction indicated by the sign bit until the offset is overcorrected again.

Figure 4:
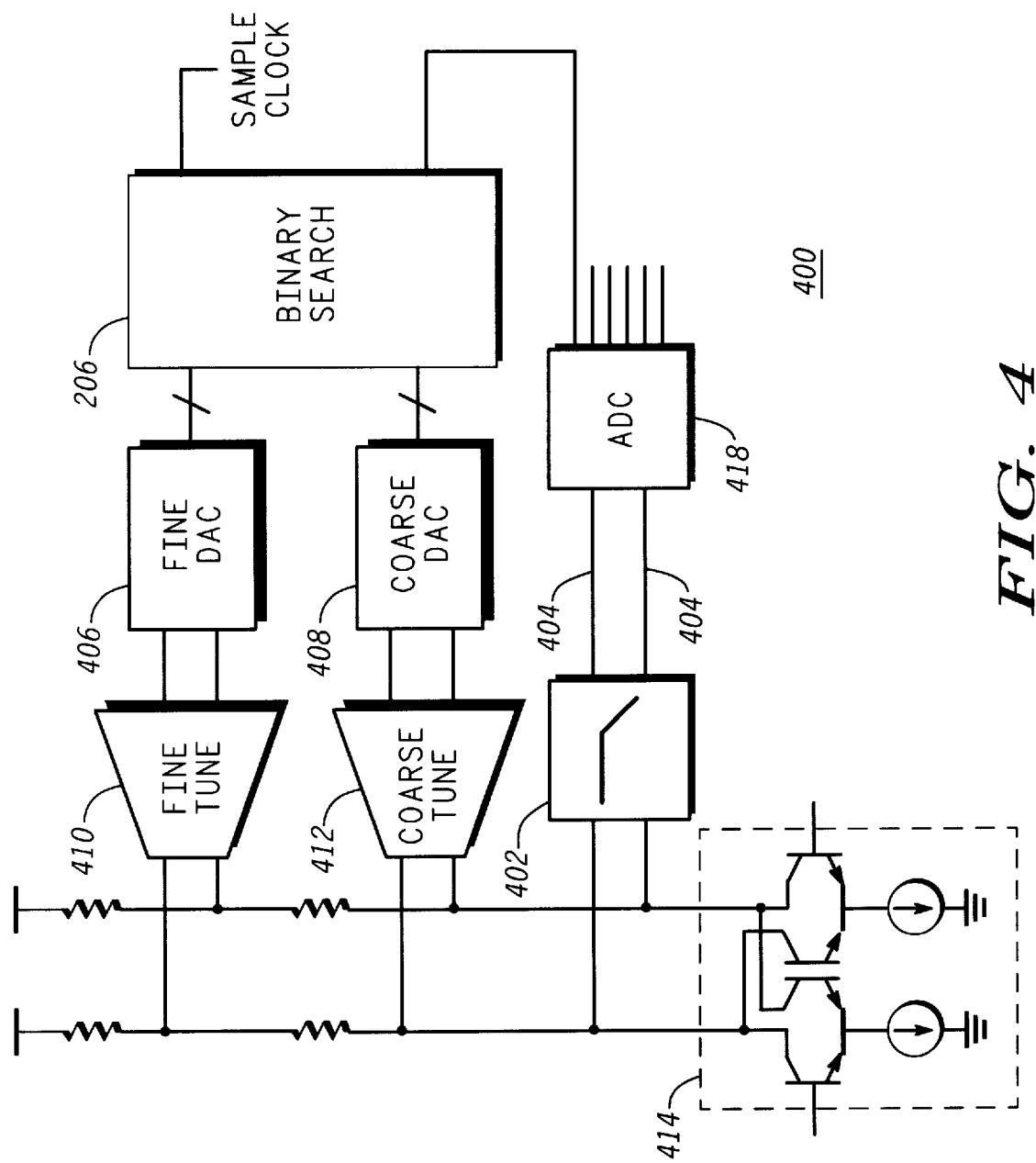
FIG. 4 is a block diagram of the DC offset correction loop of the present invention implemented in a differential system with coarse and fine tuning.

The DC offset correction loop of the present invention has applications in differential systems as well as single ended systems. FIG. 4 is a simplified block diagram of a DC offset correction loop 400 formed in accordance with the present invention and implemented in a differential system. System 400 includes a mixer 414 feeding into a gain stage formed of a baseband filter 402. Because the entire system 400 is differential, any differential offset gets amplified through the baseband filter 402 producing large undesired differential offsets at the outputs 404. In this embodiment of the invention, the sign bit generator is shown implemented using an ADC 418. Again, the binary search stage 206 is included in the feedback path in accordance with the invention and can be implemented using software or hardware as previously described. Both coarse and fine tuning are provided, if desired, through the use DACs 406, 408 and OTAs 410, 412.

The range of possible correction values and the minimum resulting offset which can be achieved using the offset correction loop of the present invention are functions of the number of DAC bits, LSB step size of the DAC, gain through the OTA(s) and their load(s), as well as the gain stage's gain. The DC offset correction loop of the present invention is particularly well suited to reliably meet the stringent timing requirements for today's communication standards.

The DC offset correction loop of the present invention can be used in both analog and digital receivers. Several advantages including fast settling time, and reduced die area are achieved using the DC offset correction loop of the present invention. Traditional analog DC offset correction loops utilize large capacitors necessitating additional pin-outs from the integrated circuit. The DC offset correction loop of the present invention eliminates the need for such capacitors, and accordingly, the extra pin-outs are eliminated as well. Furthermore, the system can digitally hold the correction value thereby providing the advantage of eliminating the high pass response associated with traditional integrator approaches. Digital storing of the correction value also avoids the capacitor leakage problems associated with trying to hold the correction value in the traditional analog system. Direct conversion receivers and zero IF applications will benefit from the advantages of this correction loop.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A DC offset correction loop, comprising:
   a gain stage having an input with a DC offset and an output providing an amplified DC offset;
   a sign bit generator for generating a sign bit in response to the amplified DC offset;
   a binary search means for generating a string of bits in response to the sign bit;
   a DAC set at a predetermined bit setting, the DAC being stepped to a new bit setting in response to the string of bits generated by the binary search means, the DAC converting the new bit setting into an analog voltage; and the analog voltage being used to adjust the DC offset at the gain stage input.

2. The DC offset correction loop of claim 1, wherein the sign bit generator comprises a comparator.

3. The DC offset correction loop of claim 1, wherein the sign bit generator comprises an analog-to-digital converter (ADC).

4. The DC offset correction loop of claim 1, wherein the gain stage comprises a baseband filter.

5. The DC offset correction loop of claim 1, wherein the gain stage comprises an amplifier.

6. The DC offset correction loop of claim 1, wherein the predetermined bit setting of the DAC is $2^N/2$, where N represents the number of bits of the DAC.

7. The DC offset correction loop of claim 6, wherein the binary search means incrementally steps the DAC by $2^N/2^2$, $2^N/2^3$, ... 1, in the direction indicated by the sign bit.

8. The DC offset correction loop of claim 1, wherein the binary search means comprises:
a step size generator coupled to a comparator; and
an adder coupled to the step size generator.

9. The DC offset correction loop of claim 1, wherein the DC offset is produced by a mixer coupled to a baseband filter.

10. A DC offset correction loop, comprising:
a gain stage having an input with a DC offset and an output having an amplified DC offset;
a feedback loop coupled between the input and the output of the gain stage, the feedback loop including:
a sign bit generator for generating a sign bit in response to the amplified DC offset;
a binary search stage for generating a bit stream in response to the sign bit;
a DAC being stepped in response to the bit stream to produce an analog voltage; and
wherein the analog voltage of the DAC is used as a correction voltage to adjust the DC offset at the input to the gain stage.

11. The DC offset correction loop of claim 10, wherein the DAC is stepped until a least significant bit is achieved thereby providing a final correction voltage.

12. The DC offset correction loop of claim 10, wherein the final correction voltage is maintained until a new correction sequence is initiated.

13. The DC offset correction loop of claim 10, wherein the gain stage is a baseband filter.

14. The DC offset correction loop of claim 10, wherein the gain stage is an amplifier.

15. The DC offset correction loop of claim 10, wherein the sign bit generator is a comparator.

16. The DC offset correction loop of claim 10, wherein the sign bit generator is an analog-to-digital converter.

17. The DC offset correction loop of claim 10, wherein the binary search stage comprises:
a step size generator for receiving the sign bit;
control logic coupled to the step size generator; and
an adder coupled to the control logic and the step size generator for generating the bit stream in response to the sign bit.

18. The DC offset correction loop of claim 10, wherein the binary search stage utilizes a binary search algorithm for generating the bit stream in response to the sign bit.

19. A method of minimizing DC offset, comprising the steps of:
initializing a digital-to-analog converter (DAC) to a predetermined setting;
amplifying the DC offset through a gain stage;
generating a sign bit based on the amplified DC offset;
stepping the DAC by a predetermined amount in a direction indicated by the sign bit to effect a binary search;
generating an analog voltage in response to the stepped DAC;
correcting the DC offset in response to the analog voltage; and
repeating the steps of amplifying through correcting until the DC offset is corrected.

20. The method of claim 19, wherein the DC offset is corrected when a least significant bit (LSB) adjustment is generated at the DAC.

21. The method of claim 19, where the predetermined setting is $2^N/2$, where N represents the bit size of the DAC.

22. The method of claim 21, wherein the step of stepping the DAC includes the steps of incrementally stepping the DAC by $2^N/2^2$, $2^N/2^3$, ..., 1 step sizes.

23. The method of claim 19, further comprising the steps of:
maintaining the DAC setting until a new programming event occurs; and
re-initiating the steps of initializing through repeating in response to the new programming event.

24. The method of claim 19, wherein the gain stage comprises a baseband filter.

25. The method of claim 19, wherein the step of stepping the DAC includes the steps of:
coarse tuning the DAC by stepping the DAC in the direction indicated by the sign bit;
detecting when the sign bit changes; and
stepping the DAC by least significant bit steps in the direction indicated by the sign bit until the sign bit changes.

26. The method of claim 19, wherein the step of stepping the DAC includes the steps of:
coarse tuning the DAC by stepping the DAC in the direction indicated by the sign bit;
detecting when the sign bit changes; and
coarse stepping the DAC by one step in the opposite direction in response to the sign bit changing;
stepping the DAC by least significant bit steps in the direction indicated by the sign bit until the sign bit changes.

27. A DC offset correction loop, comprising:
a gain stage having an input with a DC offset and an output having an amplified DC offset;
a feedback loop coupled between the input and the output of the gain stage, the feedback loop including:
a sign bit generator for generating a sign bit in response to the amplified DC offset;
a binary search stage for generating a bit stream in response to the sign bit;
a first DAC being stepped in response to the bit stream to produce a coarse tuning analog voltage with which to coarse tune the loop;
a second DAC being stepped in response to the bit stream to produce a fine tuning analog voltage with which to fine tune the loop; and
wherein the coarse tuning analog voltage is generated while the fine tuning analog voltage is held without correction, and the fine tuning analog voltage is generated while the coarse tuning analog voltage is held constant, the coarse and fine tuning voltages being used as correction voltages to adjust the DC offset at the input to the gain stage.

28. A DC offset correction loop as described in claim 27, wherein the DC offset correction loop is implemented in a differential system.

29. A DC offset correction loop as described in claim 27, wherein the DC offset correction loop is implemented in a single ended system.

30. The DC offset correction loop of claim 27, wherein the sign bit generator comprises a comparator.

31. The DC offset correction loop of claim 27, wherein the sign bit generator comprises an analog-to-digital converter (ADC).

32. The DC offset correction loop of claim 27, wherein the gain stage comprises a baseband filter.

33. The DC offset correction loop of claim 27, wherein the gain stage comprises an amplifier.

34. The DC offset correction loop of claim 27, wherein the first DAC coarse tunes the loop by being incrementally stepped in the direction indicated by the sign bit until the offset has been overcorrected, the first DAC being decremented by one step in response to the loop being overcorrected.

35. The DC offset correction loop of claim 34, wherein the second DAC fine tunes the loop by being incrementally stepped until the offset is overcorrected again.

36. The DC offset correction loop of claim 35, wherein the DC offset being overcorrected is determined by the sign bit changing.

* * * * *